United States Patent [19]
Rush et al.

[11] Patent Number: 6,086,323
[45] Date of Patent: Jul. 11, 2000

[54] METHOD FOR SUPPLYING WAFERS TO AN IC MANUFACTURING PROCESS

[75] Inventors: John M. Rush, Mountain View; Torben Ulander, Sunnyvale; Michael T. Verdon, San Jose, all of Calif.

[73] Assignee: Fortrend Engineering Corporation, Sunnyvale, Calif.

[21] Appl. No.: 09/343,110

[22] Filed: Jun. 29, 1999

Related U.S. Application Data

[63] Continuation of application No. 08/400,039, Mar. 7, 1995, Pat. No. 5,984,610.

[51] Int. Cl.[7] .................................................. B65G 49/07
[52] U.S. Cl. .......................... 414/811; 414/805; 414/940
[58] Field of Search .................................. 414/217, 403, 414/411, 416, 422, 744.5, 744.7, 744.8, 805, 811, 940

[56] References Cited

U.S. PATENT DOCUMENTS

| | | | |
|---|---|---|---|
| 4,705,444 | 11/1987 | Tullis et al. | 414/217 X |
| 5,261,935 | 11/1993 | Ishii et al. | 414/217 X |
| 5,372,471 | 12/1994 | Wu | 414/217 X |
| 5,562,383 | 10/1996 | Iwai et al. | 414/217 |
| 5,788,458 | 8/1998 | Bonora et al. | 414/416 X |
| 5,810,537 | 9/1998 | Briner et al. | 414/217 |
| 5,885,045 | 3/1999 | Rush | 414/217 X |
| 5,895,191 | 4/1999 | Bonora et al. | 414/217 |
| 5,934,991 | 8/1999 | Rush | 414/416 X |

FOREIGN PATENT DOCUMENTS

| | | | |
|---|---|---|---|
| 552756 | 7/1993 | European Pat. Off. | 414/940 |
| 4326309 | 9/1994 | Germany | 414/940 |
| 5017006 | 1/1993 | Japan | 414/940 |
| 6048507 | 2/1994 | Japan | 414/940 |

*Primary Examiner*—James W. Keenan
*Attorney, Agent, or Firm*—Donald E. Schreiber

[57] ABSTRACT

A method for unloading silicon wafers contained in a cassette from a sealed pod and supplying the wafers to an IC manufacturing process. The method includes receiving a base of the pod onto a loading platform of a pod loader interface and then unlocking the pod cover from the base. While maintaining the wafers in a clean mini-environment, the method raises the pod cover away from the base, contacts the now exposed cassette with an end effector of an articulated arm, secures the cassette to the end effector, and activates the arm to transport the wafers out of mini-environment for supplying the wafers to an IC manufacturing process. Preferably, the method further includes raising the articulated arm to lift the cassette before transferring the wafers to the process. Even more preferred, the method directs a flow of clean air within the mini-environment horizontally past the wafers.

62 Claims, 5 Drawing Sheets

METHOD FOR SUPPLYING WAFERS TO AN IC MANUFACTURING PROCESS

This is a continuation of application Ser. No. 08/400,039 filed Mar. 7, 1995, which issued Nov. 16, 1999, as U.S. Pat. No. 5,984,610.

FIELD OF THE INVENTION

The present invention relates generally to silicon wafer handling machines, and more particularly is a machine adapted to unload and reload SMIF (Standard Mechanical InterFace) pods, a pod loader interface (PLI).

BACKGROUND OF THE INVENTION

Handling of silicon wafers is critical to the IC manufacturing process. Any physical damage to the wafers will of course decrease the chip yield, which is a prime factor for the profitability of the manufacturing operation. Contamination of the wafer by particulate or other contaminants will also lead to a decreased yield.

The desire to shield the wafers from contaminants has led to the development and use of SMIF pods in the semiconductor Industry. The SMIF pods allow wafers to be transported in a sealed environment so that they are not exposed to ambient air.

Once the SMIF pods reach their destination, they must be opened, and the wafer boat inside must be placed in position for the desired process operation. If the unloading and positioning operation is performed manually, the wafers are subjected to the usual risk of damage from mishandling as well as increased exposure to contamination.

Nowhere in the prior art has there been disclosed a machine which will automatically unload a SMIF pod and position the wafers contained therein so as to be ready for the next process operation, and then reload the wafers when the process step is completed.

OBJECTS, SUMMARY, AND ADVANTAGES OF THE INVENTION

Accordingly, it is an object of the present invention to provide a means to automatically open and unload, and later reload, a SMIF pod.

The present invention is a machine that is able to automatically open a SMIF pod and unload the contents thereof. An elevator raises the SMIF cover away from its base to reveal the wafer boat contained in the SMIF pod. An articulated arm thereafter reaches through an opening in a bulkhead of the machine, securing the wafer cassette and withdrawing it through the hole in the bulkhead. The wafer cassette is then placed in position to be operated upon by the next step in the manufacturing process. The machine includes an integrated clean air system to provide a clean environment for the wafers.

An advantage of the present invention is that it allows the load/unload height of the pods to be between 32" and 35". Current art loaders are at 52" and above.

Another advantage of the present invention is that it reduces loading and unloading time, thereby reducing overall processing time.

A further advantage of the present invention is that its construction (very stable carriages traveling on dual rails) allows the motion of the articulated arm and the elevator to be always repeatable following setup of the machine.

A still further advantage is that the machine of the present invention requires less space than other systems and is completely self-contained.

These and other objects and advantages of the present invention will become apparent to those skilled in the art in view of the description of the best presently known mode of carrying out the invention as described herein and as illustrated in the drawings.

BEST MODE OF CARRYING OUT THE INVENTION

Figure 1:
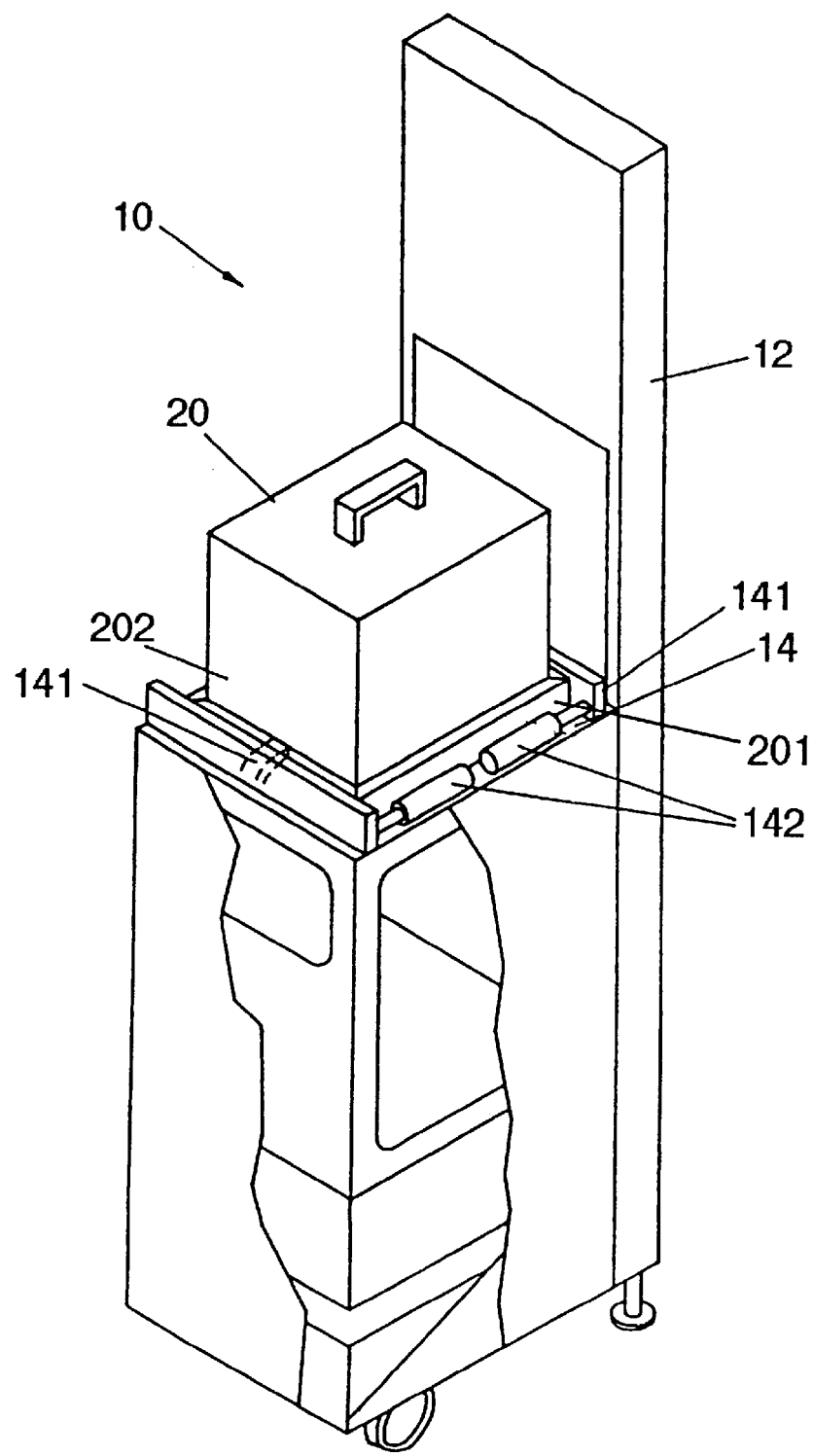
FIG. 1 is a front perspective view of the pod loader interface of the present invention.
Figure 2:
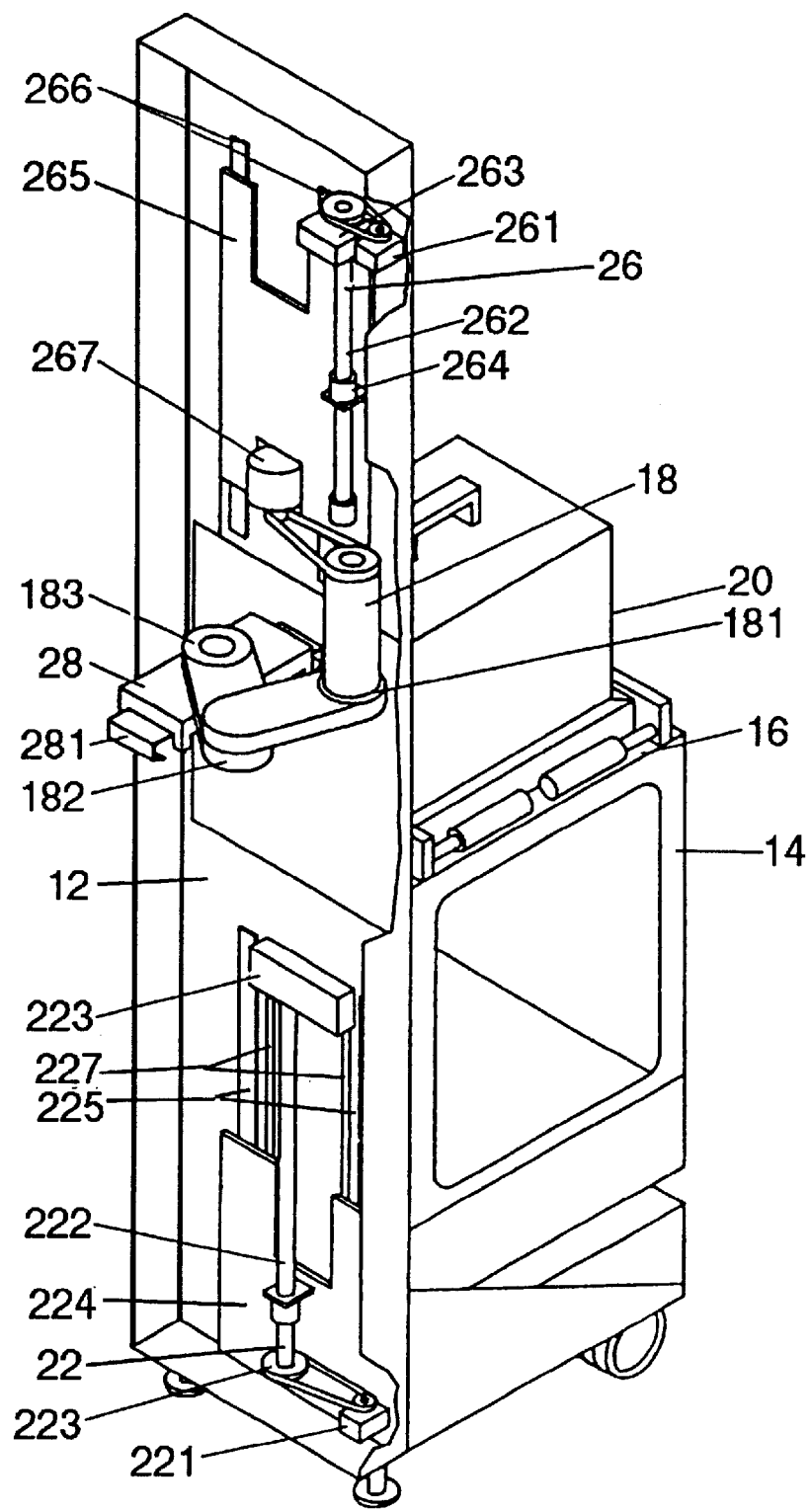
FIG. 2 is a rear perspective view of the pod loader interface of the present invention.
Figure 3:
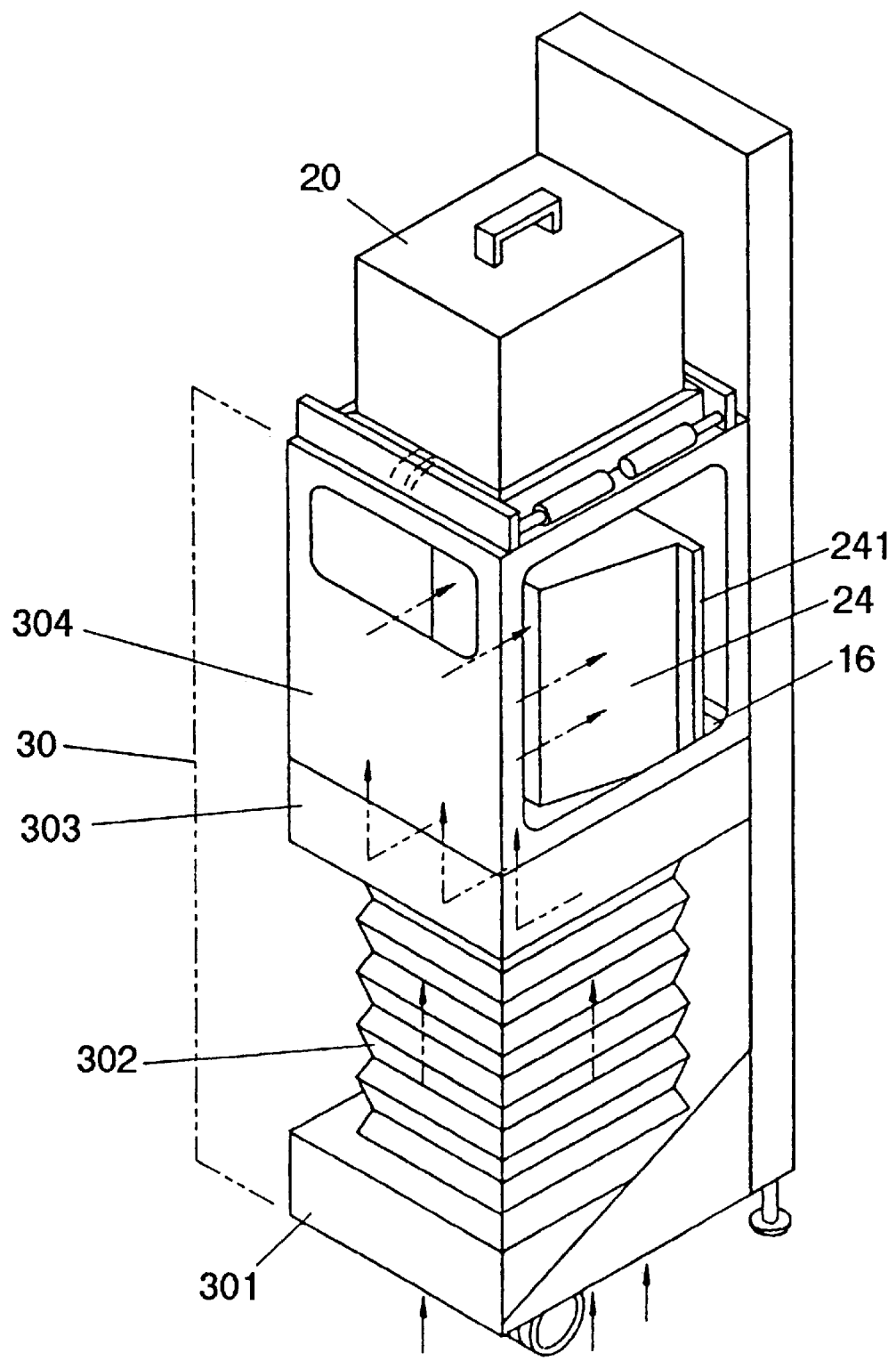
FIG. 3 is a front perspective view of the pod loader interface in the raised position.

The present invention is a pod loader interface 10. Referring now to FIGS. 1, 2, and 3 it can be seen that the machine comprises a supporting bulkhead 12, an elevator 14, a loading platform 16, and an articulated arm 18.

The loading platform 16 is adapted to receive a SMIF pod 20. (The loading platform 16 can be seen in FIG. 3.) An unlocking mechanism is contained in the loading platform 16 to release the mechanism locking a base 201 to the cover 202 of the SMIF pod 20. Means to perform the unlocking procedure are well known in the art, and thus are not described in detail herein or pictured in the drawings.

The elevator 14 is the means used to remove the cover 202 from the SMIF pod 20. Clamps 141 controlled by air cylinders 142 are used to secure the SMIF pod 20 in position on the elevator 14 before the elevator 14 is raised to open the pod 20.

An elevator drive mechanism 22 raises and lowers the elevator 14. The elevator drive mechanism 22 includes a motor 221 which turns, via a belt-and-pulley linkage, a lead screw 222. The lead screw 222 is affixed via two mounting blocks 223 to the bulkhead 12. An elevator carriage 224 travels up and down along two guide rails 225. The carriage 224 is affixed to the elevator 14 by two connecting arms. The connecting arms slide along slots 227 in the rear of the bulkhead 12, allowing the elevator 14 to be raised and lowered.

The use of the dual guide rails and the extremely stable carriage allows the motion of the elevator to have unmatched repeatability and reliability.

The articulated arm 18 is the means used to grasp and move a wafer cassette or boat 24 contained within the SMIF pod 20. The arm 18 includes pivoting shoulder 181, elbow 182, and wrist 183 joints to allow a complete range of motion in the horizontal direction. (The prior art machines also require motion in the vertical direction to effect a horizontal movement, thereby increasing the chances of machine failure.)

An arm vertical drive 26 provides the arm 18 with the ability to move wafer boats in the vertical direction. The vertical drive 26 includes a second motor 261 which turns, via a belt-and-pulley linkage, a lead screw 262. The lead screw 262 is affixed to the bulkhead 12 via a mounting block 263. A bearing assembly 264 affixed to an arm carriage 265 allows the lead screw 262 to drive the arm carriage 265 up and down. The arm carriage 265 travels up and down along two guide rails 266. The arm carriage 265 is affixed to an upper end of the articulated arm 18, so that the arm 18 is moved up and down with the carriage 265.

The arm carriage 265 also supports a third motor 267 which provides the impetus for the horizontal travel means of the articulated arm 18. The third motor 267 also uses a belt-and-pulley linkage to transmit rotational force to the arm 18.

An end effector 28 affixed to an end of the arm 18 allows the machine to grasp and secure the boat 24. Gripping means 281 are extended and retracted by air cylinders.

Figure 4:
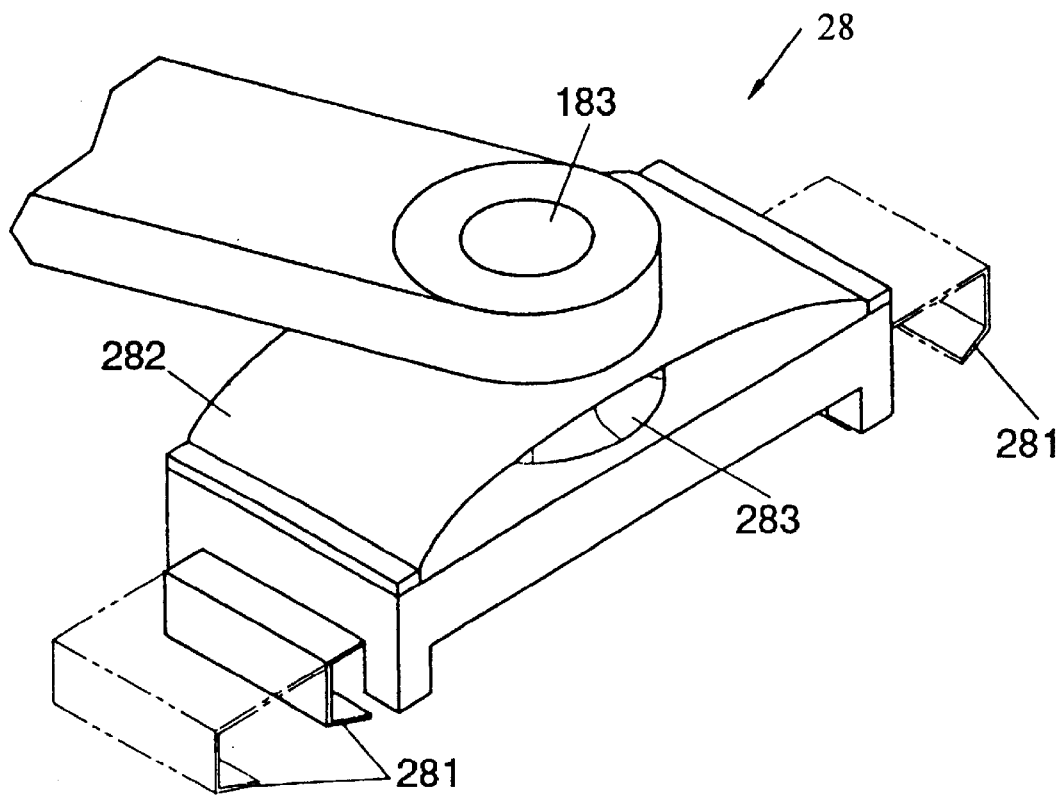
FIG. 4 is a perspective view of the end effector of the present invention.
Figure 5:
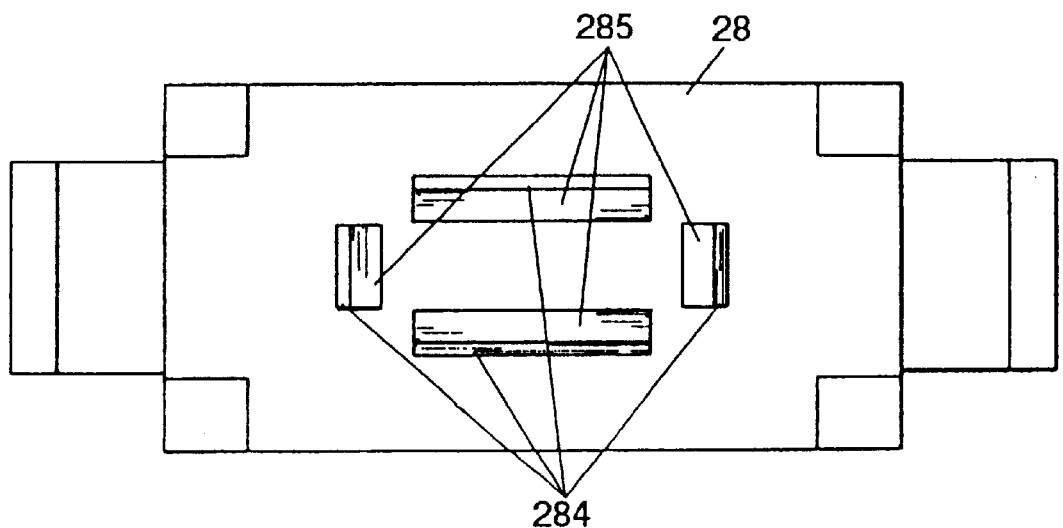
FIG. 5 is an underside view of the end effector of the present invention.

The end effector 28 is shown in further detail in FIGS. 4 and 5. The open position of the gripping means 281 is shown in phantom in FIG. 4. The end effector 28 is mounted on the articulated arm 18 by means of a leaf spring assembly 282. In order for the machine to determine when it has made contact with the boat 24, a sensing means 283 is installed on an upper surface of the end effector 28. In the preferred embodiment, the sensing means 283 is a thin film piezo-electric sensor.

FIG. 5 shows the aligning means 284 installed on an underside of the end effector 28. The aligning means 284 in the preferred embodiment is a set of four blocks situated around a center point. The blocks each have a tapered inner surface 285 to create a funneling means to guide the handle (not shown) on the boat to a centered position. If the alignment of the handle, and hence the boat, is not perfectly centered when the effector 28 is pushed onto it, the guide blocks direct the boat into an exactly centered position.

The pod loader interface also includes an integrated air flow system 30 to provide filtered air to maintain a clean mini-environment. Components of the air flow system 30 can be seen in FIG. 3. A fan installed in a fan housing 301 draws in air from the atmosphere. The air flows upward through a manifold 302. The manifold feeds the air into a filter contained in the filter housing 303 to remove any particulate matter. The air then flows upward through a plenum chamber 304 contained in the housing of the loading platform. The air then flows outward horizontally through a membrane contained in an inner wail of the plenum chamber 304, so that it flows across the surface of the wafers. The horizontal air flow across the surface of the wafers allows the present invention to process the wafers in a far cleaner environment than that available in prior art equipment.

Operation of the pod loader interface 10 to load and unload a wafer boat is as follows: An operator places a SMIF pod 20 containing a cassette 24 on the loading platform 16. (The loading platform 16 is contained in a mini-environment to maintain cleanroom conditions.) The machine is activated, and the pod 20 is unlocked. The elevator 14 secures the clamps 141 on the cover 202 of the SMIF pod 20. The elevator 14 raises to its highest position, as shown in FIG. 3, lifting the cover 202 away from the wafer boat 24.

The articulated arm 18 is then moved into position over the boat 24. The gripping means 281 of the end effector 28 are retracted by the air cylinders 282, thus securing the boat 24 by means of protruding ridges 241 on the boat 24. The arm 18 then lifts the boat 24 from the loading platform 16, and places it into the proper position for the desired process operation.

After the manufacturing process operation is completed, the PLI process is reversed to re-load the wafer cassette 24 back into the SMIF pod 20 for transport to the next desired location.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

I claim:

1. A method for unloading silicon wafers that are contained in a wafer cassette from a sealed pod and for supplying the silicon wafers to an IC manufacturing process, the sealed pod includes a pod cover which locks to a base of the pod for sealing within the pod the silicon wafers contained in the wafer cassette, the method comprising the steps of:

a. receiving the sealed pod onto a loading platform of a pod loader interface;

b. clamping the sealed pod to the pod loader interface;

c. unlocking the pod cover from the base of the pod; and d. while maintaining the silicon wafers and the wafer cassette in a clean mini-environment provided by the pod loader interface:

i. raising the pod cover away from the base of the pod thereby revealing the silicon wafers contained in the wafer cassette; and ii. contacting the wafer cassette with an end effector of an articulated arm and securing the wafer cassette to the end effector; and e. activating the articulated arm to transport the silicon wafers contained in the wafer cassette out of mini-environment provided by the pod loader interface through an opening that pierces the bulkhead for supplying the silicon wafers to an IC manufacturing process.

2. The method of claim 1 further comprising the step of raising the articulated arm to lift the wafer cassette containing the silicon wafers from the base of the pod received on the loading platform before activating the articulated arm to transport the silicon wafers contained in the wafer cassette.

3. The method of claim 2 wherein the pod loader interface includes a bulkhead that is pierced by an opening through which the articulated arm transports the silicon wafers contained in the wafer cassette in supplying the silicon wafers to an IC manufacturing process.

4. The method of claim 2 wherein the pod loader interface includes a bulkhead that supports the articulated arm, and that is pierced by an opening through which the articulated arm transports the silicon wafers contained in the wafer cassette in supplying the silicon wafers to an IC manufacturing process.

5. The method of claim 2 wherein joints included in the articulated arm enable straight line horizontal motion of the end effector and the silicon wafers contained in the wafer cassette in supplying the silicon wafers to an IC manufacturing process.

6. The method of claim 2 wherein the end effector includes gripping means, the method further comprising the step of activating the gripping means to secure the wafer cassette to the end effector by engaging protruding ridges on the wafer cassette.

7. The method of claim 6 wherein the articulated arm includes sensing means, the method further comprising the step of detecting with the sensing means when the gripping means contacts the wafer cassette.

8. The method of claim 2 wherein the pod loader interface includes a clean air system for maintaining the silicon wafers and the wafer cassette in the clean mini-environment during and after raising the pod cover away from the base of the pod, the method further comprising the step of directing a flow of clean air horizontally past the silicon wafers contained in the wafer cassette within the mini-environment.

9. The method of claim 1 wherein the pod loader interface includes a bulkhead that is pierced by an opening through which the articulated arm transports the silicon wafers contained in the wafer cassette in supplying the silicon wafers to an IC manufacturing process.

10. The method of claim 1 wherein the pod loader interface includes a bulkhead that supports the articulated arm, and that is pierced by an opening through which the articulated arm transports the silicon wafers contained in the wafer cassette in supplying the silicon wafers to an IC manufacturing process.

11. The method of claim 1 wherein joints included in the articulated arm enable straight line horizontal motion of the end effector and the silicon wafers contained in the wafer cassette in supplying the silicon wafers to an IC manufacturing process.

12. The method of claim 1 wherein the end effector includes gripping means, the method further comprising the step of activating the gripping means to secure the wafer cassette to the end effector by engaging protruding ridges on the wafer cassette.

13. The method of claim 12 wherein the articulated arm includes sensing means, the method further comprising the step of detecting with the sensing means when the gripping means contacts the wafer cassette.

14. The method of claim 1 wherein the pod loader interface includes a clean air system for maintaining the silicon wafers and the wafer cassette in the clean mini-environment during and after raising the pod cover away from the base of the pod, the method further comprising the step of directing a flow of clean air horizontally past the silicon wafers contained in the wafer cassette within the mini-environment.

15. A method for unloading silicon wafers that are contained in a wafer cassette from a sealed pod and for supplying the silicon wafers to an IC manufacturing process, the sealed pod includes a pod cover which locks to a base of the pod for sealing within the pod the silicon wafers contained in the wafer cassette, the method comprising the steps of:
   a. receiving the sealed pod onto a loading platform of a pod loader interface;
   b. clamping the sealed pod to the pod loader interface;
   c. unlocking the pod cover from the base of the pod; and
   d. while maintaining the silicon wafers and the wafer cassette in a clean mini-environment provided by the pod loader interface:
      i. raising the pod cover away from the base of the pod thereby revealing the silicon wafers contained in the wafer cassette; and
      ii. contacting the wafer cassette with an end effector of an articulated arm that is supported from a bulkhead of the pod loader interface, and securing the wafer cassette to the end effector; and
   e. activating the articulated arm to transport the silicon wafers contained in the wafer cassette out of the mini-environment provided by the pod loader interface through an opening that pierces the bulkhead for supplying the silicon wafers to an IC manufacturing process.

16. The method of claim 15 further comprising the step of raising the articulated arm to lift the wafer cassette containing the silicon wafers from the base of the pod received on the loading platform before activating the articulated arm to transport the silicon wafers contained in the wafer cassette.

17. The method of claim 16 wherein joints included in the articulated arm enable straight line horizontal motion of the end effector and the silicon wafers contained in the wafer cassette in supplying the silicon wafers to an IC manufacturing process.

18. The method of claim 16 wherein the end effector includes gripping means, the method further comprising the step of activating the gripping means to secure the wafer cassette to the end effector by engaging protruding ridges on the wafer cassette.

19. The method of claim 18 wherein the articulated arm includes sensing means, the method further comprising the step of detecting with the sensing means when the gripping means contacts the wafer cassette.

20. The method of claim 16 wherein the pod loader interface includes a clean air system for maintaining the silicon wafers and the wafer cassette in a clean mini-environment during and after raising the pod cover away from the base of the pod, the method further comprising the step of directing a flow of clean air horizontally past the silicon wafers contained in the wafer cassette.

21. The method of claim 15 wherein joints included in the articulated arm enable straight line horizontal motion of the end effector and the silicon wafers contained in the wafer cassette in supplying the silicon wafers to an IC manufacturing process.

22. The method of claim 15 wherein the end effector includes gripping means, the method further comprising the step of activating the gripping means to secure the wafer cassette to the end effector by engaging protruding ridges on the wafer cassette.

23. The method of claim 22 wherein the articulated arm includes sensing means, the method further comprising the step of detecting with the sensing means when the gripping means contacts the wafer cassette.

24. The method of claim 15 wherein the pod loader interface includes a clean air system for maintaining the silicon wafers and the wafer cassette in a clean mini-environment during and after raising the pod cover away from the base of the pod, the method further comprising the step of directing a flow of clean air horizontally past the silicon wafers contained in the wafer cassette.

25. A method for unloading silicon wafers that are contained in a wafer cassette from a sealed pod and for supplying the silicon wafers to an IC manufacturing process, the sealed pod includes a pod cover which locks to a base of the pod for sealing within the pod the silicon wafers contained in the wafer cassette, the method comprising the steps of:
   a. receiving the sealed pod onto an exposed loading platform of a pod loader interface;
   b. clamping the sealed pod to the pod loader interface;
   c. unlocking the pod cover from the base of the pod; and
   d. while maintaining the silicon wafers and the wafer cassette in a clean mini-environment provided by the pod loader interface:
      i. raising the pod cover away from the base of the pod thereby revealing the silicon wafers contained in the wafer cassette; and
      ii. contacting the wafer cassette with an end effector of an articulated arm and securing the wafer cassette to the end effector; and
   e. activating the articulated arm to transport the silicon wafers contained in the wafer cassette out of the mini-environment provided by the pod loader interface for supplying the silicon wafers to an IC manufacturing process.

26. The method of claim 25 further comprising the step of raising the articulated arm to lift the wafer cassette containing the silicon wafers from the base of the pod received on the loading platform before activating the articulated arm to transport the silicon wafers contained in the wafer cassette.

27. The method of claim 26 wherein the pod loader interface includes a bulkhead that is pierced by an opening through which the articulated arm transports the silicon wafers contained in the wafer cassette in supplying the silicon wafers to an IC manufacturing process.

28. The method of claim 26 wherein the pod loader interface includes a bulkhead that supports the articulated arm, and that is pierced by an opening through which the articulated arm transports the silicon wafers contained in the wafer cassette in supplying the silicon wafers to an IC manufacturing process.

29. The method of claim 26 wherein joints included in the articulated arm enable straight line horizontal motion of the end effector and the silicon wafers contained in the wafer cassette in supplying the silicon wafers to an IC manufacturing process.

30. The method of claim 26 wherein the end effector includes gripping means, the method further comprising the step of activating the gripping means to secure the wafer cassette to the end effector by engaging protruding ridges on the wafer cassette.

31. The method of claim 30 wherein the articulated arm includes sensing means, the method further comprising the step of detecting with the sensing means when the gripping means contacts the wafer cassette.

32. The method of claim 26 wherein the pod loader interface includes a clean air system for maintaining the silicon wafers and the wafer cassette in the clean mini-environment during and after raising the pod cover away from the base of the pod, the method further comprising the step of directing a flow of clean air horizontally past the silicon wafers contained in the wafer cassette within the mini-environment.

33. The method of claim 25 wherein the pod loader interface includes a bulkhead that is pierced by an opening through which the articulated arm transports the silicon wafers contained in the wafer cassette in supplying the silicon wafers to an IC manufacturing process.

34. The method of claim 25 wherein the pod loader interface includes a bulkhead that supports the articulated arm, and that is pierced by an opening through which the articulated arm transports the silicon wafers contained in the wafer cassette in supplying the silicon wafers to an IC manufacturing process.

35. The method of claim 25 wherein joints included in the articulated arm enable straight line horizontal motion of the end effector and the silicon wafers contained in the wafer cassette in supplying the silicon wafers to an IC manufacturing process.

36. The method of claim 25 wherein the end effector includes gripping means, the method further comprising the step of activating the gripping means to secure the wafer cassette to the end effector by engaging protruding ridges on the wafer cassette.

37. The method of claim 36 wherein the articulated arm includes sensing means, the method further comprising the step of detecting with the sensing means when the gripping means contacts the wafer cassette.

38. The method of claim 25 wherein the pod loader interface includes a clean air system for maintaining the silicon wafers and the wafer cassette in the clean mini-environment during and after raising the pod cover away from the base of the pod, the method further comprising the step of directing a flow of clean air horizontally past the silicon wafers contained in the wafer cassette within the mini-environment.

39. A method for unloading silicon wafers that are contained in a wafer cassette from a sealed pod and for supplying the silicon wafers to an IC manufacturing process, the sealed pod includes a pod cover which locks to a base of the pod for sealing within the pod the silicon wafers contained in the wafer cassette, the method comprising the steps of:

a. receiving the sealed pod onto a loading platform of a pod loader interface;

b. clamping the sealed pod to the pod loader interface;

c. unlocking the pod cover from the base of the pod; and d. while maintaining the silicon wafers and the wafer cassette in a clean mini-environment provided by the pod loader interface:

i. raising the pod cover away from the base of the pod thereby revealing the silicon wafers contained in the wafer cassette; and ii. contacting the wafer cassette with an end effector of an articulated arm and securing the wafer cassette to the end effector; and e. activating the articulated arm to transport the silicon wafers contained in the wafer cassette out of the mini-environment provided by the pod loader interface along a substantially straight line for supplying the silicon wafers to an IC manufacturing process.

40. The method of claim 39 further comprising the step of raising the articulated arm to lift the wafer cassette containing the silicon wafers from the base of the pod received on the loading platform before activating the articulated arm to transport the silicon wafers contained in the wafer cassette.

41. The method of claim 40 wherein the pod loader interface includes a bulkhead that is pierced by an opening through which the articulated arm transports the silicon wafers contained in the wafer cassette in supplying the silicon wafers to an IC manufacturing process.

42. The method of claim 40 wherein the pod loader interface includes a bulkhead that supports the articulated arm, and that is pierced by an opening through which the articulated arm transports the silicon wafers contained in the wafer cassette in supplying the silicon wafers to an IC manufacturing process.

43. The method of claim 40 wherein the end effector includes gripping means, the method further comprising the step of activating the gripping means to secure the wafer cassette to the end effector by engaging protruding ridges on the wafer cassette.

44. The method of claim 43 wherein the articulated arm includes sensing means, the method further comprising the step of detecting with the sensing means when the gripping means contacts the wafer cassette.

45. The method of claim 40 wherein the pod loader interface includes a clean air system for maintaining the silicon wafers and the wafer cassette in the clean mini-environment during and after raising the pod cover away from the base of the pod, the method further comprising the step of directing a flow of clean air horizontally past the silicon wafers contained in the wafer cassette within the mini-environment.

46. The method of claim 39 wherein the pod loader interface includes a bulkhead that is pierced by an opening through which the articulated arm transports the silicon wafers contained in the wafer cassette in supplying the silicon wafers to an IC manufacturing process.

47. The method of claim 39 wherein the pod loader interface includes a bulkhead that supports the articulated arm, and that is pierced by an opening through which the articulated arm transports the silicon wafers contained in the wafer cassette in supplying the silicon wafers to an IC manufacturing process.

48. The method of claim 39 wherein the end effector includes gripping means, the method further comprising the step of activating the gripping means to secure the wafer cassette to the end effector by engaging protruding ridges on the wafer cassette.

49. The method of claim 48 wherein the articulated arm includes sensing means, the method further comprising the step of detecting with the sensing means when the gripping means contacts the wafer cassette.

50. The method of claim 39 wherein the pod loader interface includes a clean air system for maintaining the silicon wafers and the wafer cassette in the clean mini-environment during and after raising the pod cover away from the base of the pod, the method further comprising the step of directing a flow of clean air horizontally past the silicon wafers contained in the wafer cassette within the mini-environment.

51. A method for unloading silicon wafers that are contained in a wafer cassette from a sealed pod and for supplying the silicon wafers to an IC manufacturing process, the sealed pod includes a pod cover which locks to a base of the pod for sealing within the pod the silicon wafers contained in the wafer cassette, the method comprising the steps of:
  a. receiving the sealed pod onto a loading platform of a pod loader interface;
  b. clamping the sealed pod to the pod loader interface;
  C. unlocking the pod cover from the base of the pod; and
  d. while maintaining the silicon wafers and the wafer cassette in a clean mini-environment provided by the pod loader interface:
    i. raising the pod cover away from the base of the pod thereby revealing the silicon wafers contained in the wafer cassette; and
    ii. contacting the wafer cassette with an end effector of an articulated arm and securing the wafer cassette to the end effector;
  e. directing a flow of clean air horizontally past the silicon wafers contained in the wafer cassette within the mini-environment; and
  f. activating the articulated arm to transport the silicon wafers contained in the wafer cassette out of the mini-environment provided by the pod loader interface for supplying the silicon wafers to an IC manufacturing process.

52. The method of claim 51 further comprising the step of raising the articulated arm to lift the wafer cassette containing the silicon wafers from the base of the pod received on the loading platform before activating the articulated arm to transport the silicon wafers contained in the wafer cassette.

53. The method of claim 52 wherein the pod loader interface includes a bulkhead that is pierced by an opening through which the articulated arm transports the silicon wafers contained in the wafer cassette in supplying the silicon wafers to an IC manufacturing process.

54. The method of claim 52 wherein the pod loader interface includes a bulkhead that supports the articulated arm, and that is pierced by an opening through which the articulated arm transports the silicon wafers contained in the wafer cassette in supplying the silicon wafers to an IC manufacturing process.

55. The method of claim 52 wherein joints included in the articulated arm enable straight line horizontal motion of the end effector and the silicon wafers contained in the wafer cassette in supplying the silicon wafers to an IC manufacturing process.

56. The method of claim 52 wherein the end effector includes gripping means, the method further comprising the step of activating the gripping means to secure the wafer cassette to the end effector by engaging protruding ridges on the wafer cassette.

57. The method of claim 56 wherein the articulated arm includes sensing means, the method further comprising the step of detecting with the sensing means when the gripping means contacts the wafer cassette.

58. The method of claim 51 wherein the pod loader interface includes a bulkhead that is pierced by an opening through which the articulated arm transports the silicon wafers contained in the wafer cassette in supplying the silicon wafers to an IC manufacturing process.

59. The method of claim 51 wherein the pod loader interface includes a bulkhead that supports the articulated arm, and that is pierced by an opening through which the articulated arm transports the silicon wafers contained in the wafer cassette in supplying the silicon wafers to an IC manufacturing process.

60. The method of claim 51 wherein joints included in the articulated arm enable straight line horizontal motion of the end effector and the silicon wafers contained in the wafer cassette in supplying the silicon wafers to an IC manufacturing process.

61. The method of claim 51 wherein the end effector includes gripping means, the method further comprising the step of activating the gripping means to secure the wafer cassette to the end effector by engaging protruding ridges on the wafer cassette.

62. The method of claim 61 wherein the articulated arm includes sensing means, the method further comprising the step of detecting with the sensing means when the gripping means contacts the wafer cassette.

* * * * *